US008128846B2

(12) United States Patent
Yang et al.

(10) Patent No.: US 8,128,846 B2
(45) Date of Patent: Mar. 6, 2012

(54) SILVER COMPOSITION FOR MICRO-DEPOSITION DIRECT WRITING SILVER CONDUCTOR LINES ON PHOTOVOLTAIC WAFERS

(75) Inventors: Haixin Yang, Chapel Hill, NC (US); Roberto Irizarry, Raleigh, NC (US); Patricia J. Ollivier, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 123 days.

(21) Appl. No.: 12/473,339

(22) Filed: May 28, 2009

(65) Prior Publication Data
US 2009/0294741 A1    Dec. 3, 2009

Related U.S. Application Data

(60) Provisional application No. 61/056,592, filed on May 28, 2008.

(51) Int. Cl.
*H01B 1/22* (2006.01)

(52) U.S. Cl. .................................................... 252/514
(58) Field of Classification Search ........... 252/512–514
See application file for complete search history.

(56) References Cited

U.S. PATENT DOCUMENTS 5,378,408 A * 1/1995 Carroll et al. ................. 252/514
5,403,376 A * 4/1995 DeVolk et al. ................. 75/255
(Continued)

FOREIGN PATENT DOCUMENTS

EP          1713091 A2    10/2006
(Continued)

OTHER PUBLICATIONS

International Search Report for International Application No. PCT/US2009/045389 Dated August 20, 2009.

*Primary Examiner* — Mark Kopec

(57) ABSTRACT

Embodiments of the invention relate to a silicon semiconductor device, and a conductive thick film composition for use in a solar cell device.

8 Claims, 1 Drawing Sheet

U.S. PATENT DOCUMENTS

| | | | |
|---|---|---|---|
| 7,037,448 B2 * | 5/2006 | Nagai et al. | 252/514 |
| 7,504,349 B2 * | 3/2009 | Brown et al. | 501/19 |
| 2003/0100824 A1 | 5/2003 | Warren et al. | |
| 2006/0231800 A1 | 10/2006 | Wang et al. | |
| 2006/0231801 A1 * | 10/2006 | Carroll et al. | 252/500 |
| 2006/0231803 A1 | 10/2006 | Wang et al. | |
| 2006/0231804 A1 | 10/2006 | Wang et al. | |
| 2006/0272700 A1 | 12/2006 | Young et al. | |
| 2009/0098350 A1 * | 4/2009 | Mears | 428/208 |
| 2009/0107707 A1 * | 4/2009 | Yamakawa et al. | 174/257 |

FOREIGN PATENT DOCUMENTS

| | | | |
|---|---|---|---|
| EP | 1713092 | * | 10/2006 |
| EP | 1713092 A2 | | 10/2006 |

* cited by examiner

SILVER COMPOSITION FOR MICRO-DEPOSITION DIRECT WRITING SILVER CONDUCTOR LINES ON PHOTOVOLTAIC WAFERS

FIELD OF THE INVENTION

Embodiments of the invention relate to a silicon semiconductor device, and a conductive thick film composition for use in a solar cell device.

TECHNICAL BACKGROUND OF THE INVENTION

A conventional solar cell structure with a p-type base has a negative electrode that may be on the front-side (also termed sun-side or illuminated side) of the cell and a positive electrode that may be on the opposite side. Radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

There is a need for compositions, structures (for example, semiconductor, solar cell or photodiode structures), and semiconductor devices (for example, semiconductor, solar cell or photodiode devices) which have improved electrical performance, and methods of making.

SUMMARY OF THE INVENTION

An embodiment of the invention relates to composition including: (a) one or more conductive materials; (b) one or more inorganic binders; and (c) organic vehicle, wherein 1 to 15% of the inorganic components are submicron particles. In an embodiment, 85 to 99% of the inorganic components may have a d50 of 1.5 to 10 microns. In an embodiment, one or more conductive materials may include silver. In an embodiment, a portion of the silver contains submicron particles. In an embodiment, the submicron particles have a d50 of 0.1 to 1 microns. In an embodiment, the submicron particles have a d50 of 0.1 to 0.6 microns. In an embodiment, the particles have a bimodal size distribution.

The composition may include one or more additives selected from the group consisting of: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof. In an embodiment, the additives may include ZnO, or a compound that forms ZnO upon firing. In an embodiment, the ZnO and/or inorganic binder may include submicron particles. The ZnO may be 2 to 10 wt % of the total composition. The glass frit may be 1 to 6 wt % of the total composition. The conductive material may include Ag. The Ag may be 90 to 99 wt % of the solids in the composition. In an embodiment, the inorganic components may be 70 to 95 wt % of the total composition.

A further embodiment relates to a method of manufacturing a semiconductor device including the steps of: (a) providing a semiconductor substrate, one or more insulating films, and the thick film composition described herein; (b) applying the insulating film to the semiconductor substrate; (c) applying the thick film composition to the insulating film on the semiconductor substrate, and (d) firing the semiconductor, insulating film and thick film composition. In an aspect, the insulating film may include one or more components selected from: titanium oxide, silicon nitride, SiNx:H, silicon oxide, and silicon oxide/titanium oxide.

A further embodiment relates to a semiconductor device made by the methods described herein. An aspect relates to a semiconductor device including an electrode, wherein the electrode, prior to firing, includes the composition described herein. An embodiment relates to a solar cell including the semiconductor device.

An embodiment relates to a semiconductor device including a semiconductor substrate, an insulating film, and a front-side electrode, wherein the front-side electrode comprises one or more components selected from the group consisting of zinc-silicate, willemite, and bismuth silicates.

Figure 1A:
FIG. 1 is a process flow diagram illustrating the fabrication of a semiconductor device.
Figure 1B:
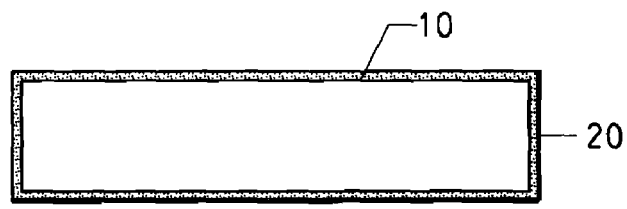
Figure 1C:
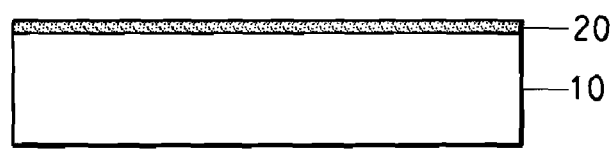
Figure 1D:
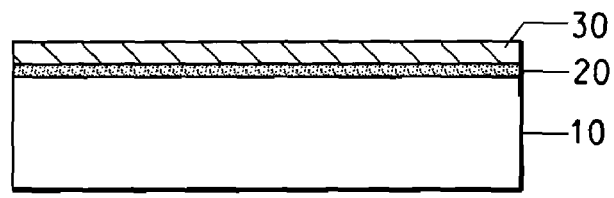
Figure 1E:
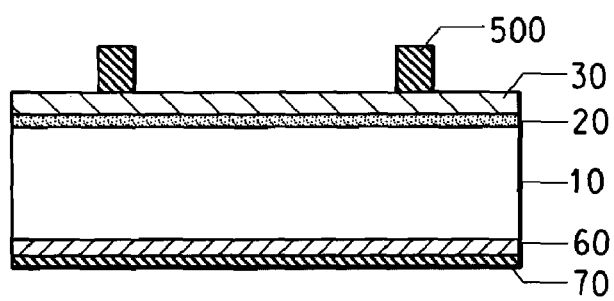
Figure 1F:
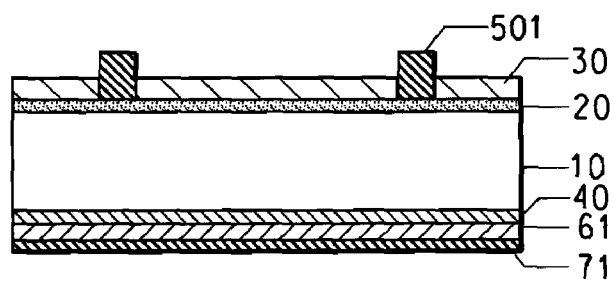

Reference numerals shown in FIG. 1 are explained below.
10: p-type silicon substrate
20: n-type diffusion layer
30: silicon nitride film, titanium oxide film, or silicon oxide film
40: p+ layer (back surface field, BSF)
60: aluminum paste formed on backside
61. aluminum back electrode (obtained by firing back side aluminum paste)
70: silver or silver/aluminum paste formed on backside
71: silver or silver/aluminum back electrode (obtained by firing back side silver paste)
500: silver paste formed on front side according to the invention
501: silver front electrode according to the invention (formed by firing front side silver paste)

DETAILED DESCRIPTION OF THE INVENTION

There is a need for improved solar cells with increased efficiency. There is a need for conductive compositions suitable for the formation of narrow conductor lines with increased height. An aspect of the invention relates to compositions containing submicron particles. The compositions may be thick film compositions. These compositions may be used to form solar cell electrodes. The electrodes may be on the front-side of a solar cell. In an embodiment, the electrode lines may be narrow and have increased height.

As used herein, "thick film composition" refers to a composition which, upon firing on a substrate, has a thickness of 1 to 100 microns. The thick film compositions may contain a conductive material, a glass composition, and organic vehicle. The thick film composition may include additional components. As used herein, the additional components are termed "additives".

The compositions described herein include one or more electrically functional materials and one or more glass frits dispersed in an organic medium. These compositions may be thick film compositions. The compositions may also include one or more additive(s). Exemplary additives may include metals, metal oxides or any compounds that can generate these metal oxides during firing.

In an embodiment, the electrically functional powders may be conductive powders. In an embodiment, the composition (s), for example conductive compositions, may be used in a semiconductor device. In an aspect of this embodiment, the semiconductor device may be a solar cell or a photodiode. In a further aspect of this embodiment, the semiconductor device may be one of a broad range of semiconductor devices. In an embodiment, the semiconductor device may be a solar cell.

In an embodiment, the thick film compositions described herein may be used in a solar cell. In an aspect of this embodiment, the solar cell efficiency may be greater than 70% of the reference solar cell. In a further embodiment, the solar cell efficiency may be greater than 80% of the reference solar cell. The solar cell efficiency may be greater than 90% of the reference solar cell.

In an embodiment, the ratio of organic medium in the thick film composition to the inorganic components in the dispersion may be dependent on the method of applying the paste and the kind of organic medium used, as determined by one of skill in the art. In an embodiment, the dispersion may include 70-95 wt % of inorganic components and 5-30 wt % of organic medium (vehicle) in order to obtain good wetting.

In an embodiment, a portion of the inorganic components may be submicron particles. In an aspect of this embodiment, the submicron particles may have a d50 of 0.1 to 1 microns. In a further aspect, the submicron particles may have a d50 of 0.1 to 0.8 microns. In a further aspect, the submicron particles may have a d50 of 0.2 to 0.6 microns.

In an embodiment, the submicron particles may be 1 to 15 wt % of the composition. In a further embodiment, the submicron particles may be 2 to 10 wt % of the composition. In a further embodiment, the submicron particles may be 3 to 6 wt % of the composition.

In an embodiment, the submicron particles may include a portion of the conductive material. In an aspect, 1 to 15 wt % of the conductive material may be submicron particles. In a further aspect, 2 to 10 wt % of the conductive material may be submicron particles. In a further aspect, 3 to 6 wt % of the conductive composition may be submicron particles.

In an embodiment, a portion of the composition may have a d50 of 1.5 to 10 microns. In an aspect of this embodiment, 85 to 99 wt % of the inorganic components of the composition may have a d50 of 1.5 to 10 microns. In an aspect of this embodiment, a portion of the composition may have a d50 of 2.0 to 7.0 microns. In an aspect of this embodiment, a portion of the composition may have a d50 of 2.5 to 5.0 microns.

In a further aspect, the conductive material may include silver. In an aspect, 50 to 100 wt % of the conductive material may be silver. In a further aspect, 70 to 99 wt %, 70 to 98 wt %, or 80 to 95 wt % of the conductive material may be silver.

Glass Frits

In an aspect of the invention, the composition includes glass frit compositions. Glass frit compositions useful in the present invention will readily recognized by one of skill in the art. Glass frit compositions useful in compositions used to make front-side solar cell electrodes may be used, for example. Exemplary glass frit compositions include lead borosilicate glasses. In an embodiment, glass frits compositions useful in the present invention may include 20-24 wt % $SiO_2$, 0.2-0.8 wt % $Al_2O_3$, 40-60 wt % PbO, and 5-8 wt % $B_2O_3$. In an embodiment, the glass frit composition may optionally also include 3-7 wt % $TiO_2$. In an embodiment, the glass frit composition may optionally also include one or more fluorine-containing components, including but not limited to: salts of fluorine, fluorides, metal oxyfluoride compounds, and the like. Such fluorine-containing components include, but are not limited to $PbF_2$, $BiF_3$, $AlF_3$, NaF, LiF, KF, CsF, $ZrF_4$, $TiF_4$ and/or $ZnF_2$. In an embodiment, the glass frit composition may include 8-13 wt % $PbF_2$.

In a further aspect of this embodiment, thick film composition may include electrically functional powders and glass-ceramic frits dispersed in an organic medium. In an embodiment, these thick film conductor composition(s) may be used in a semiconductor device. In an aspect of this embodiment, the semiconductor device may be a solar cell or a photodiode.

Conductive Materials

In an embodiment, the thick film composition may include a functional phase that imparts appropriate electrically functional properties to the composition. In an embodiment, the electrically functional powder may be a conductive powder. In an embodiment, the electrically functional phase may include conductive materials (also termed conductive particles, herein). The conductive particles may include conductive powders, conductive flakes, or a mixture thereof, for example.

In an embodiment, the conductive particles may include Ag. In a further embodiment, the conductive particles may include silver (Ag) and aluminum (Al). In a further embodiment, the conductive particles may, for example, include one or more of the following: Cu, Au, Ag, Pd, Pt, Al, Ag—Pd, Pt—Au, etc. In an embodiment, the conductive particles may include one or more of the following: (1) Al, Cu, Au, Ag, Pd and Pt; (2) alloy of Al, Cu, Au, Ag, Pd and Pt; and (3) mixtures thereof.

In an embodiment, the functional phase of the composition may include coated or uncoated silver particles which are electrically conductive. In an embodiment in which silver particles are coated, they are at least partially coated with a surfactant. In an embodiment, the surfactant may include one or more of the following non-limiting surfactants: stearic acid, palmitic acid, a salt of stearate, a salt of palmitate, lauric acid, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

In an embodiment, the silver may be 60 to 90 wt % of the paste composition. In a further embodiment, the silver may be 70 to 85 wt % of the paste composition. In a further embodiment, the silver may be 75 to 85 wt % of the paste composition. In a further embodiment, the silver may be 78 to 82 wt % of the paste composition.

In an embodiment, the silver may be 90 to 99 wt % of the solids in the composition (i.e., excluding the organic vehicle). In a further embodiment, the silver may be 92 to 97 wt % of the solids in the composition. In a further embodiment, the silver may be 93 to 95 wt % of the solids in the composition.

As used herein, "particle size" is intended to mean "average particle size"; "average particle size" means the 50% volume distribution size. Volume distribution size may be determined by a number of methods understood by one of skill in the art, including but not limited to LASER diffraction and dispersion method using a Microtrac particle size analyzer.

In an embodiment, a portion of the conductive materials may be submicron particles. In an aspect of this embodiment, the submicron particles may have a d50 of 0.1 to 1 microns. In a further aspect, the submicron particles may have a d50 of 0.1 to 0.8 microns. In a further aspect, the submicron particles may have a d50 of 0.2 to 0.6 microns.

In an embodiment, 1 to 15 wt % of the conductive material may be submicron particles. In a further aspect, 2 to 10 wt % of the conductive material may be submicron particles. In a further aspect, 3 to 6 wt % of the conductive composition may be submicron particles.

In an embodiment, a portion of the conductive materials may have a d50 of 1.5 to 10 microns. In an aspect of this embodiment, 85 to 99 wt % of the conductive materials may have a d50 of 1.5 to 10 microns. In an aspect of this embodiment, a portion of the conductive materials may have a d50 of 2.0 to 7.0 microns. In an aspect of this embodiment, a portion of the conductive materials may have a d50 of 2.5 to 5.0 microns.

Additives

In an embodiment, the thick film composition may include one or more additives. In an embodiment, the additive may be selected from one or more of the following: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

In an embodiment, the additive may include a Zn-containing additive. The Zn-containing additive may include one or more of the following: (a) Zn, (b) metal oxides of Zn, (c) any compounds that can generate metal oxides of Zn upon firing, and (d) mixtures thereof. In an embodiment, the Zn-containing additive may include Zn resinate.

In an embodiment, the Zn-containing additive may include ZnO. In an embodiment, a portion of the ZnO may include submicron particles.

In an embodiment, ZnO may be present in the composition in the range of 2-10 wt % total composition. In an embodiment, the ZnO may be present in the range of 3-7 wt % total composition. In a further embodiment, the ZnO may be present in the range of 4-6 wt % total composition.

Organic Medium

In an embodiment, the thick film compositions described herein may include organic medium. The inorganic components may be mixed with an organic medium, for example, by mechanical mixing to form pastes. A wide variety of inert viscous materials can be used as organic medium. In an embodiment, the organic medium may be one in which the inorganic components are dispersible with an adequate degree of stability. In an embodiment, the rheological properties of the medium may lend certain application properties to the composition, including: stable dispersion of solids, appropriate viscosity and thixotropy for screen printing, appropriate wettability of the substrate and the paste solids, a good drying rate, and good firing properties. In an embodiment, the organic vehicle used in the thick film composition may be a nonaqueous inert liquid. The use of various organic vehicles, which may or may not contain thickeners, stabilizers and/or other common additives, is contemplated. The organic medium may be a solution of polymer(s) in solvent(s). In an embodiment, the organic medium may also include one or more components, such as surfactants. In an embodiment, the polymer may be ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. In an embodiment, the solvents useful in thick film compositions described herein include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In a further embodiment, the organic medium may include volatile liquids for promoting rapid hardening after application on the substrate.

In an embodiment, the polymer may be present in the organic medium in the range of 8 wt. % to 11 wt. % of the total composition, for example. The thick film silver composition may be adjusted to a predetermined, screen-printable viscosity with the organic medium.

Fired Thick Film Compositions

In an embodiment, the organic medium may be removed during the drying and firing of the semiconductor device. In an aspect, the glass frit, Ag, and additives may be sintered during firing to form an electrode. The fired electrode may include components, compositions, and the like, resulting from the firing and sintering process. In an aspect of this embodiment, the semiconductor device may be a solar cell or a photodiode.

Method of Making a Semiconductor Device

An embodiment relates to methods of making a semiconductor device. In an embodiment, the semiconductor device may be used in a solar cell device. The semiconductor device may include a front-side electrode, wherein, prior to firing, the front-side (illuminated-side) electrode may include composition(s) described herein.

In an embodiment, the method of making a semiconductor device includes the steps of: (a) providing a semiconductor substrate; (b) applying an insulating film to the semiconductor substrate; (c) applying a composition described herein to the insulating film; and (d) firing the device.

Exemplary semiconductor substrates useful in the methods and devices described herein are recognized by one of skill in the art, and include, but are not limited to: single-crystal silicon, multicrystalline silicon, ribbon silicon, and the like. The semiconductor substrate may be junction bearing. The semiconductor substrate may be doped with phosphorus and boron to form a p/n junction. Methods of doping semiconductor substrates are understood by one of skill in the art.

The semiconductor substrates may vary in size (length× width) and thickness, as recognized by one of skill in the art. In a non-limiting example, the thickness of the semiconductor substrate may be 50 to 500 microns; 100 to 300 microns; or 140 to 200 microns. In a non-limiting example, the length and width of the semiconductor substrate may both equally be 100 to 250 mm; 125 to 200 mm; or 125 to 156 mm.

Exemplary insulating films useful in the methods and devices described herein are recognized by one of skill in the art, and include, but are not limited to: silicon nitride, silicon oxide, titanium oxide, $SiN_x$:H, hydrogenated amorphous silicon nitride, and silicon oxide/titanium oxide film. The insulating film may be formed by PECVD, CVD, and/or other techniques known to one of skill in the art. In an embodiment in which the insulating film is silicon nitride, the silicon nitride film may be formed by a plasma enhanced chemical vapor deposition (PECVD), thermal CVD process, or physical vapor deposition (PVD). In an embodiment in which the insulating film is silicon oxide, the silicon oxide film may be formed by thermal oxidation, thermal CVD, plasma CVD, or PVD. The insulating film (or layer) may also be termed the anti-reflective coating (ARC).

Compositions described herein may be applied to the ARC-coated semiconductor substrate by a variety of methods known to one of skill in the art, including, but not limited to, screen-printing, ink-jet, coextrusion, syringe dispense, direct writing, and aerosol ink jet. In an embodiment, compositions may be applied to substrates using methods and devices described in US patent application publication 2003/0100824, which is hereby incorporated herein by reference. The composition may be applied in a pattern. The composition may be applied in a predetermined shape and at a predetermined position. In an embodiment, the composition may be used to form both the conductive fingers and busbars of the front-side electrode. In an embodiment, the width of the lines of the conductive fingers may be 10 to 200 microns; 40 to 150 microns; or 60 to 100 microns. In an embodiment, the width of the lines of the conductive fingers may be 10 to 100 microns; 15 to 80 microns; or 20 to 75 microns. In an embodiment, the thickness of the lines of the conductive fingers may be 5 to 50 microns; 10 to 35 microns; or 15 to 30 microns. In a further embodiment, the composition may be used to form the conductive, Si contacting fingers.

The composition coated on the ARC-coated semiconductor substrate may be dried as recognized by one of skill in the art, for example, for 0.5 to 10 minutes, and then fired. In an embodiment, volatile solvents and organics may be removed during the drying process. Firing conditions will be recognized by one of skill in the art. In exemplary, non-limiting, firing conditions the silicon wafer substrate is heated to maximum temperature of between 600 and 900° C. for a duration of 1 second to 2 minutes. In an embodiment, the maximum silicon wafer temperature reached during firing ranges from 650 to 800 C. for a duration of 1 to 10 seconds. In a further embodiment, the electrode formed from the conductive thick film composition(s) may be fired in an atmosphere composed of a mixed gas of oxygen and nitrogen. This firing process removes the organic medium and sinters the glass frit with the Ag powder in the conductive thick film composition. In a further embodiment, the electrode formed from the conductive thick film composition(s) may be fired above the organic medium removal temperature in an inert atmosphere not containing oxygen. This firing process sinters or melts base metal conductive materials such as copper in the thick film composition.

In an embodiment, during firing, the fired electrode (preferably the fingers) may react with and penetrate the insulating film, forming electrical contact with the silicon substrate.

In a further embodiment, prior to firing, other conductive and device enhancing materials are applied to the opposite type region of the semiconductor device and cofired or sequentially fired with the compositions described herein. The opposite type region of the device is on the opposite side of the device. The materials serve as electrical contacts, passivating layers, and solderable tabbing areas.

In an embodiment, the opposite type region may be on the non-illuminated (back) side of the device. In an aspect of this embodiment, the back-side conductive material may contain aluminum. Exemplary back-side aluminum-containing compositions and methods of applying are described, for example, in US 2006/0272700, which is hereby incorporated herein by reference.

In a further aspect, the solderable tabbing material may contain aluminum and silver. Exemplary tabbing compositions containing aluminum and silver are described, for example in US 2006/0231803, which is hereby incorporated herein by reference.

In a further embodiment the materials applied to the opposite type region of the device are adjacent to the materials described herein due to the p and n region being formed side by side. Such devices place all metal contact materials on the non illuminated (back) side of the device to maximize incident light on the illuminated (front) side.

The semiconductor device may be manufactured by the following method from a structural element composed of a junction-bearing semiconductor substrate and a silicon nitride insulating film formed on a main surface thereof. The method of manufacture of a semiconductor device includes the steps of applying (such as coating and printing) onto the insulating film, in a predetermined shape and at a predetermined position, the conductive thick film composition having the ability to penetrate the insulating film, then firing so that the conductive thick film composition melts and passes through the insulating film, effecting electrical contact with the silicon substrate. The electrically conductive thick film composition is a thick-film paste composition, as described herein, which is made of a silver powder, Zn-containing additive, a glass or glass powder mixture having a softening point of 300 to 600° C., dispersed in an organic vehicle and optionally, additional metal/metal oxide additive(s).

An embodiment of the invention relates to a semiconductor device manufactured from the methods described herein. Devices containing the compositions described herein may contain zinc-silicates, as described above.

An embodiment of the invention relates to a semiconductor device manufactured from the method described above.

Additional substrates, devices, methods of manufacture, and the like, which may be utilized with the thick film compositions described herein are described in US patent application publication numbers US 2006/0231801, US 2006/0231804, and US 2006/0231800, which are hereby incorporated herein by reference in their entireties.

EXAMPLES

An organic medium was prepared by dissolving polymers in organic solvent at about 100 C. Into the organic medium, other ingredients were added, including silver powder, glass frits, zinc oxide and other additives. The resulting mixture was dispersed by a three roll-milling process, known in thick film paste manufacturing industry. Compositions I, II, and III, shown in Table 1, were formed.

Pastes from the compositions I and II were filtered through a Roki 40L-SHP-200XS filter capsule before print. Composition III was used without filtration.

Pastes were evaluated at room temperature by a 3D-450 Smart Pump™ printer that is made by nScrypt Inc, using re-useable ceramic pen tip of ID/OD 50/75 µm. Pump pressure was between 10 psi and 100 psi. The printing speed was between 200 mm per second and 300 mm per second. The gap between pen tip and substrate surface is 150 µm.

Groups of ten four inches long lines were printed, dried in a box oven at 150 C. for 20 minutes, and fired in a belt furnace at 850 C. peak temperatures for 2 minutes.

TABLE I

Summary of Silver Paste Compositions

| Ingredient | Composition I | Composition II | Composition III |
|---|---|---|---|
| Silver Powder I | 81.05 | | |
| Silver Powder II | | 81.05 | |
| Silver Powder III | | | 81.05 |
| Glass Frit I | 2.5 | | |
| Glass Frit II | | 2.5 | |
| Glass Frit III | | | 2.5 |
| Zinc Oxide | 5.5 | 5.5 | 5.5 |
| Organic Medium | 10.95 | 10.95 | 10.95 |

* based on wt % of total composition
Silver powder I, a mixture of spherical and flake shapes with size of D10 = 0.88, D50 = 4.60, D95 = 10.73 microns.
Silver powder II, a spherical shape powder, with size of D10 = 1.0, D50 = 1.71, D95 = 4.41 microns and surface area of 0.44 m2/g.
Silver powder III, a spherical shape powder, with size of D10 = 0.26, D50 = 0.45, D95 = 1.67 microns, with solid of 99.5%. Its surface area is 1.0 m2/g.
Glass frit I, $SiO_2$ 23.0%, $Al_2O_3$ 0.4%, PbO 58.8% and $B_2O_3$ 7.8%, based on wt % of glass composition, with a size of D10 = 0.36, D50 = 0.61 and D95 = 1.44 microns.
Glass frit II, $SiO_2$ 22.08%, $Al_2O_3$ 0.38%, PbO 46.68%, $B_2O_3$ 6.79%, $TiO_2$ 5.86% and $PbF_2$ 10.72%, based on wt % of glass composition, with size of D10 = 0.42, D50 = 0.77 and D90 = 1.96 microns.
Glass frit III, $SiO_2$ 22.08%, $Al_2O_3$ 0.38%, PbO 46.68%, $B_2O_3$ 6.79%, $TiO_2$ 5.86% and $PbF_2$ 10.72%, based on wt % of glass composition, with a size of D10 = 0.34, D50 = 0.50 and D95 = 0.89 microns.
Zinc oxide, purchased from Aldrich Chemicals.

Example I

Composition I was able to go through the 50/75 micron pen tip under pump pressure less than 50 psi for less than a period of 5 minutes before the pen tip was clogged. The best resulting fired lines were 83 microns wide and 13 microns tall.

Example II

Composition I was able to go through the 75/125 micron pen tip under pump pressure less than 60 psi for less than a period of 30 minutes before the pen tip was clogged. The best resulting fired lines were 100 microns wide and 12 microns tall.

Example III

Composition II was able to go through the 50/75 micron pen tip under pump pressure ranging from 10 psi to 100 psi for a period of at least 30 minutes before printing was stopped. The best resulting fired lines were 89 microns wide and 19 microns tall.

Example IV

A blend of composition II and composition III with a weight percentage ratio of 95.5 to 4.5 was able to go through the 50/75 micron pen tip under pump pressure ranging from 10 psi to 80 psi for a period of at least 3 hours before printing was stopped. The best resulting fired lines were 67 microns wide and 25 microns tall.

Example V

Composition III could not be printed through a 50/75 micron pen tip under a pump pressure larger than 30 psi. Under 30 psi, printing lasted for less than 5 seconds before pen tip was clogged.

Example VI

Composition III could be printed through a 75/125 micron pen tip under a pump pressure larger than 60 psi. Under 60 psi, printing lasted for less than 5 minutes before pen tip was clogged.

Example VII

A series of blends of composition II and III with ratios ranging from 90 to 10 to 10 to 90 by weight was prepared and printed. Once the composition III was more than 30%, 50/75 micron pen tip was clogged within 1 minute.

Example VIII

The efficiency of the above printed substrates are analyzed. An exemplary efficiency test is provided below. It is predicted that the efficiency of the solar cell from Example IV will be greater than the efficiency of the solar cells from the other Examples.

Test Procedure-Efficiency

The solar cells built according to the method described herein are tested for conversion efficiency. An exemplary method of testing efficiency is provided below.

In an embodiment, the solar cells built according to the method described herein are placed in a commercial I-V tester for measuring efficiencies (ST-1000). The Xe Arc lamp in the I-V tester simulates the sunlight with a known intensity and irradiated the front surface of the cell.

The tester uses a multi-point contact method to measure current (I) and voltage (V) at approximately 400 load resistance settings to determine the cell's I-V curve. Both fill factor (FF) and efficiency (Eff) are calculated from the I-V curve.

What is claimed is:

1. A composition comprising:
    (a) one or more conductive materials comprising silver;
    (b) one or more inorganic binders; and
    (c) organic vehicle,
    wherein (i) 1 to 15% of the conductive components are submicron particles; (ii) wherein 85 to 99% of the conductive components have a d50 of 1.5 to 10 microns; and wherein the conductive components (i) and (ii) have a bimodal size distribution.

2. The composition of claim 1, wherein the submicron particles have a d50 of 0.1 to 0.6 microns.

3. The composition of claim 1 further comprising one or more additives.

4. The composition of claim 3, wherein the one or more additives comprise components selected from the group consisting of:
    (a) a metal wherein said metal is selected from Zn, Pb, Bi, Gd, Ce, Zr, Ti, Mn, Sn, Ru, Co, Fe, Cu, and Cr;
    (b) a metal oxide of one or more of the metals selected from Zn, Pb, Bi, Gd, Ce, Zr, Ti, Mn, Sn, Ru, Co, Fe, Cu and Cr;
    (c) any compounds that can generate the metal oxides of (b) upon firing; and
    (d) mixtures thereof.

5. The composition of claim 4, wherein the one or more inorganic additives comprises ZnO.

6. The composition of claim 1, wherein the submicron particles further comprise ZnO and an inorganic binder.

7. The composition of claim 1, wherein the one or more inorganic binders comprise glass frit.

8. The composition of claim 1, wherein the inorganic components are 70 to 95 wt % of the total composition.

* * * * *